United States Patent [19]

Uchino et al.

[11] Patent Number: 5,768,187
[45] Date of Patent: Jun. 16, 1998

[54] NON-VOLATILE MULTI-STATE MEMORY DEVICE CAPABLE WITH VARIABLE STORING RESOLUTION

[75] Inventors: Takashi Uchino; Nozomu Nambu, both of Gunma; Akio Hagiwara, Saitama, all of Japan

[73] Assignee: Sanyo Electric Co., Ltd., Osaka, Japan

[21] Appl. No.: 718,928

[22] Filed: Sep. 25, 1996

[30] Foreign Application Priority Data

Sep. 28, 1995 [JP] Japan .................. 7-251447
Sep. 28, 1995 [JP] Japan .................. 7-251448

[51] Int. Cl.$^6$ ................................. G11C 11/34
[52] U.S. Cl. ................. 365/185.03; 365/185.33; 365/230.08
[58] Field of Search ............ 365/185.03, 185.11, 365/185.21, 185.22, 185.23, 185.33, 230.08

[56] References Cited

U.S. PATENT DOCUMENTS

| | | | |
|---|---|---|---|
| 5,574,879 | 11/1996 | Wells et al. | 365/185.03 |
| 5,623,436 | 4/1997 | Sowards et al. | 365/185.03 |

FOREIGN PATENT DOCUMENTS

| | | |
|---|---|---|
| 4500576 | 1/1992 | Japan . |
| 4057294 | 2/1992 | Japan . |
| 9000801 | 1/1990 | WIPO . |

*Primary Examiner*—David C. Nelms
*Assistant Examiner*—Hoai V. Ho
*Attorney, Agent, or Firm*—Loeb & Loeb LLP

[57] ABSTRACT

This non-volatile multi-state memory device switches a storing resolution of multi-state data corresponding to digital data stored in a non-volatile memory cell according to the data's characteristics. In more detail, digital audio data are output from an ADPCM encoder in n-bit units and m bits of address data indicating an address at which audio data are stored are output from an address controller. These are then input to a switching circuit, a bit number converting circuit converts m bits of address data to n bits of address data at the same level as the m bit data, and the converted n bits of address data and n bits of audio data are inputted to a second multiplexer. An output of the Second multiplexer is then selected in compliance with a switch signal from the address controller and either the selected n bits of address data or the audio data are sent to a read-write circuit. Consequently, for example, writing is carried out with storing resolution deemed as 16 when 4 bits of audio data are stored in an EEPROM cell array and storing resolution deemed as 2 when for instance 1 bit of address data is stored.

20 Claims, 9 Drawing Sheets

| OPERATION STATE | DRAIN (BL) | SOURCE (SL) | CONTROL GATE (WL) |
|---|---|---|---|
| ERASE | 0 V | 0 V | $V_{hv2}$ |
| WRITE 1 | $V_{BLH}$ | $V_{hv1}$ | $V_{B2}$ |
| WRITE 2 | $V_{BLL}$ | $V_{hv1}$ | $V_{B2}$ |
| WRITE TERMINATION | $V_{BH}$ | $V_{hv1}$ | $V_{B2}$ |
| READ | $V_{REFM}$ | 0 V | $V_{B1}$ |

$(V_{hv2} > V_{hv1} > V_{BH} = V_{B1} > V_{B2} > V_{BLH} = V_{REFM} > V_{BLL} > 0V)$

Fig. 7

NON-VOLATILE MULTI-STATE MEMORY DEVICE CAPABLE WITH VARIABLE STORING RESOLUTION

BACKGROUND OF THE INVENTION

1. Field of the Invention

The present invention relates to a non-volatile multi-state memory device using an EEPROM or the like capable of storing multi-state data.

2. Description of the Prior Art

Alteration of a threshold level by controlling the amount of electric charge injected to a floating gate and storage of analog amounts and multi-state information in a memory cell have conventionally been carried out in a non-volatile memory using EEPROM or the like provided with a floating gate.

For instance, in the published translation of PCT filed patent (JP-T 04 500576) [International Laid-open No. WO 90/00801], electric charge is injected to a floating gate by supplying a high voltage write pulse to a non-volatile memory cell while sample-holding an analog signal to be inputted using an analog sample-holding circuit. Following charge injection, an analog amount (along level) corresponding to the injected charge is read out from the memory cell and compared with the sample-held analog signal and an analog amount corresponding to the input analog voltage is thus recorded in the memory cell by repeatedly supplying a write pulse until both these analog amounts match.

Furthermore, the laid-open patent (JP-A 04-57294) discloses a non-volatile multi-state memory device wherein, in addition to latching digital data to be inputted in a data latching circuit, the multi-state storage state is read out and a sense amp is provided for outputting a digital value corresponding to this storage state. A comparator then compares this sense amp output with the data held in the data latching circuit and multi-state information is continuously written into the memory cell until the contents of both match.

In either case, the storing resolution of the analog amounts or multi-state data was fixed.

When a multi-state memory is used, since n-bit digital data such as an audio signal can be stored as 2 to the nth multi-state data in a single memory cell, required memory cell capacity can be considerably reduced compared to storage using two states.

However, when audio data or the like are stored in a multi-state memory, it is sometimes desirable to jointly store address data indicating in which portion of the memory the data has been stored in order to subsequently read out the data. With information data such as audio data, even if some errors occur when writing or reading the data to or from the memory, this is not a serious problem since the sound suffers only some change, and it may also be desirable to increase the storing resolution for the purpose of reducing storage capacity. However, when similar errors occur in address data, the reading position of audio data itself is altered. Reliability is therefore an essential requirement for address data.

However, since storage resolution has normally been fixed in conventional examples, data such as audio data for which high-density storage is desirable and data such as address data for which reliability is essential have had to be stored with the same resolution. This has resulted in the reciprocal problems that increasing the resolution adversely affects the reliability of address data and decreasing the resolution lowers the storage density of audio data.

In addition, there are also cases in which alteration of the data storage resolution is desirable even when there is only one type of data.

SUMMARY OF THE INVENTION

It is therefore the object of the present invention to solve the reciprocal problems described above by providing a non-volatile multi-state memory apparatus capable of storing digital data as multi-state data in a non-volatile memory cell array in which storing resolution is switched according to the type of digital data to be stored.

In the present invention a switching circuit is provided for executing such switching of the storing resolution.

In addition, when the plurality of digital data types comprises a first type of digital data and a second type of digital data, the storing resolution of the second type of digital data is, for instance, reduced to a lower resolution than that of the first type.

This second type of digital data is characterized in that it is address data for indicating a storing address of the first type of digital data to be stored in the non-volatile memory cell array. This address data is characterized in that it indicates, for instance, at least one storing address of a storing start address and a storing stop address of the first kind of digital data in a non-volatile memory cell array.

Data such as address data, which naturally requires high reliability, is stored at low storing resolution as described above. When storing resolution is lowered, memory recording data amount increases but reliability of data storage can be improved. Furthermore, in the opposite case, for instance when the first type of digital data are audio data, it may be desirable to increase storing density in the memory as much as possible in order to store a large amount of data. Therefore, the first type of digital data are stored at high resolution.

In addition, in the present invention, the first kind of digital data consist of n-bit data (n:whole number greater than 2), the second type of digital data consist of m-bit data (m:whole number <n) and the device comprises a writing circuit for writing inputted n-bit digital data in the non-volatile memory cell array as corresponding multi-state data. When a switch signal to be inputted is at a first level, the switching circuit outputs the n-bit first type of digital data unaltered to the writing circuit and when the switch signal is at a second level, the switching circuit converts the m-bit second type of digital data to n-bit digital data where at least the upper m-bit of the n-bit digital data is the m-bit second type of digital data and outputs the n-bit digital data to the writing circuit. Thus, the storing resolution of the first type and second types of digital data can be switched with a simple configuration.

In addition, in the present invention, when a switch signal is at a second level, the switching circuit converts the m-bit second type of digital data to n-bit digital data of which the upper m-bit is the m-bit second type of digital data and the remaining lower i-bit (i:whole number equivalent to n−m) is the same level as that of the m-bit second type of digital data. In this way the storing resolution of the second type of digital data can be set lower than the storing resolution of the first type of digital data.

According to another feature of the present invention, when a switch signal is at a second level, the switching circuit converts the m-bit second type of digital data to n-bit digital data of which the upper m bits is the m-bit second kind of digital data and the remaining lower i-bit (i:whole number equivalent to n−m) is a predetermined level. Thus, by setting the lower bit at a fixed level, the storing resolution of the second type digital of data can be reduced lower than the storing resolution of the first type of digital data.

Furthermore, the present invention has a switch signal generating circuit for generating a switch signal which varies depending on whether data to be stored are the first type of digital data or the second type of digital data and for supplying the signal to a switching circuit. For instance, when the second type of digital data is address data, an address controller or the like can be used for generating this switch signal.

Thus, according to the present invention, by switching storing resolution according to data type, storing resolution of data requiring reliability can be lowered, the data can be securely stored in a memory, while storing resolution of other data requiring high density recording can be increased thereby allowing storage of a great volume of data within a memory cell array. Therefore, both reciprocal requirements can be satisfied simultaneously.

In addition, the present invention comprises an n-bit (n=whole number greater than 2) data register for holding input n-bit digital data, a non-volatile memory cell capable of writing multi-state data, a writing circuit for writing multi-state data corresponding to the content of the data register in the non-volatile memory cell, and a gate circuit laid at the input side of the lower i-bit (i=whole number lower than n) of the n-bit data register for fixing the input digital data at a predetermined level in response to a switch signal. Therefore, according to the present invention, storing resolution can be varied and selectively given priority in accordance with the needs for maintaining data reliability and for high density recording.

BRIEF DESCRIPTION OF THE DRAWINGS

FIG. 7 is a diagram depicting a bias condition of a memory cell in the present invention.

DESCRIPTION OF THE PREFERRED EMBODIMENTS

Embodiment 1

Figure 1:
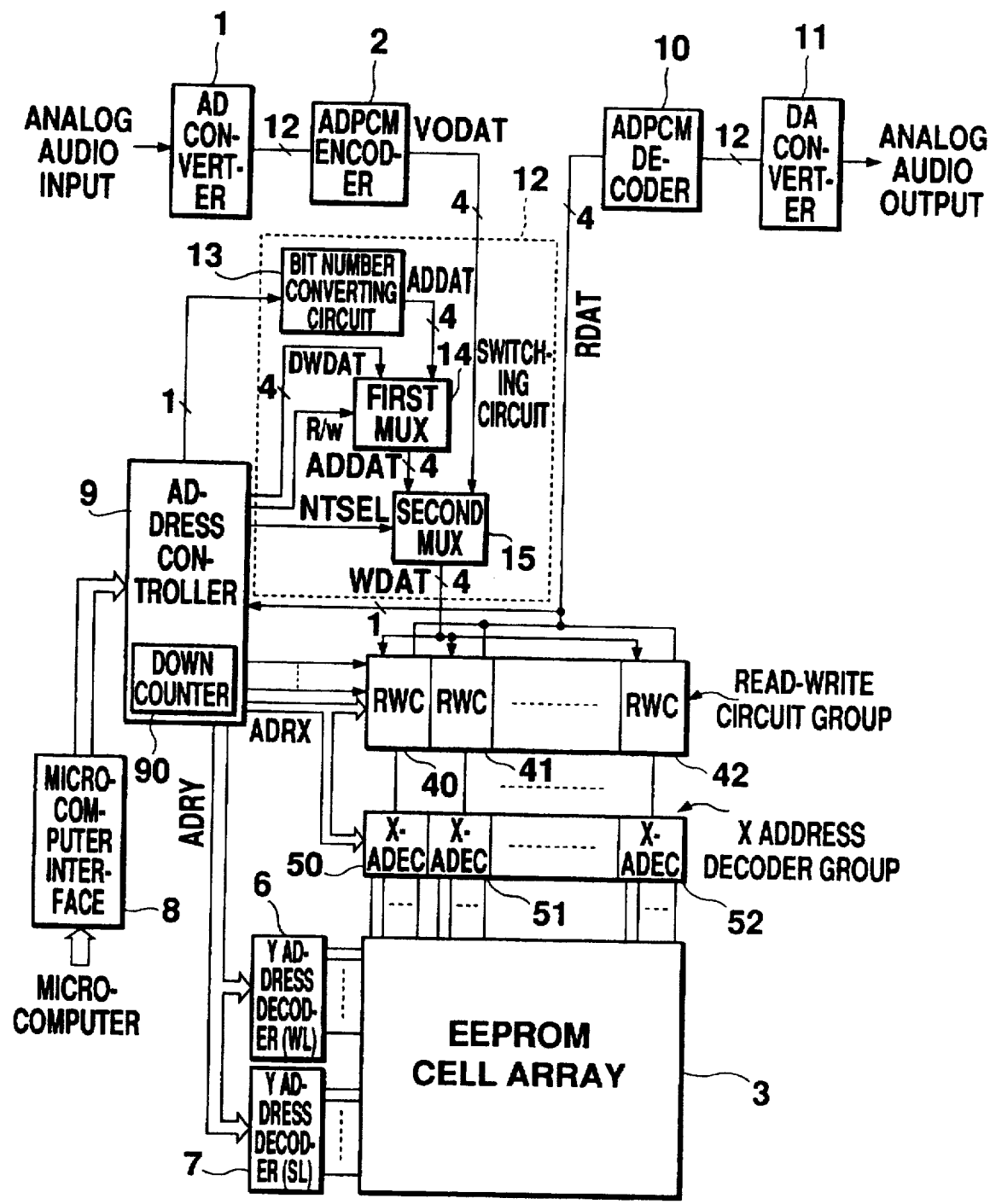
FIG. 1 is an overall block diagram of an audio record play apparatus implementing a first embodiment of the present invention.

FIG. 1 shows a summary block diagram of an audio record play apparatus implementing the first embodiment.

First, an AD converter 1 samples an analog audio signal to be inputted in a predetermined sampling period and converts it to sequential 12-bit digital audio data. An ADPCM encoder 2 codes the 12-bit data to be input to sequential 4-bit digital compressed data VODAT which it then outputs. An EEPROM cell array 3 provides a floating gate and stores multi-state data. A plurality of read-write circuits R/W 40, 41, 42 . . . write the 4-bit digital data to be inputted in the EEPROM cell array 3 as multi-state data and also read out multi-state data which have been written. X address decoders 50, 51, 52 . . . are provided at each of the read-write circuits and specify X addresses in the EEPROM cell array 3. Y address decoders 6 and 7 for word line WL and source line SL specify Y addresses of the EEPROM cell array 3. A microcomputer interface circuit 8 translates commands from a microcomputer. Based on commands from the microcomputer interface circuit 8, an address controller 9 supplies an X address ADRX and a control signal to read-write circuits 40, 41, 42, . . . and to X address decoders 50, 51, 52, . . . and supplies a Y address ADRY to the Y address decoders 6 and 7. An ADPCM decoder 10 decodes the 4-bit digital compressed data RDAT read out from the EEPROM cell array 3 to 12-bit digital audio data. A DA converter 11 DA-converts the 12-bit digital audio data and converts it to an analog audio signal which is output as audio sound from a speaker or the like not shown in the diagram.

Figure 3:
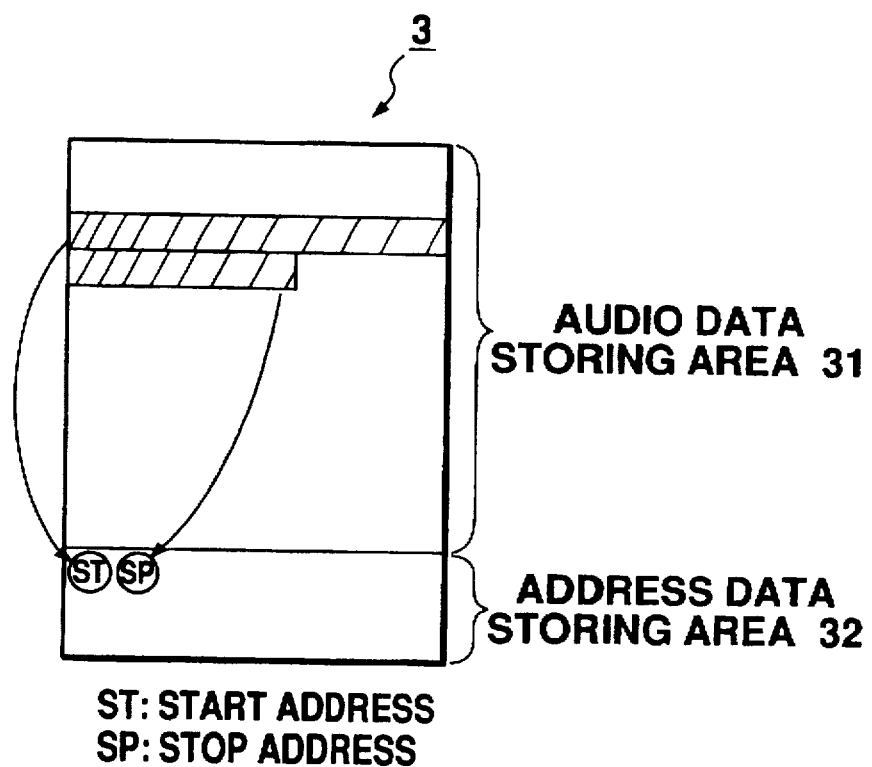
FIG. 3 is an explanatory diagram depicting a storage configuration of EEPROM data.

As FIG. 3 shows, in this apparatus the EEPROM cell array 3 has a first area 31 for storing audio data VODAT output from the ADPCM encoder 2 and a second area 32 for storing start and stop addresses indicating the first and last address of stored audio data. In order to store these start and stop addresses in the EEPROM cell array 3, in write mode the address controller 9 outputs a start address and a stop address as address data ADDAT. However, unlike audio data output every 4 bits, address data are output each 1 bit. Thus X and Y addresses totalling 20 bits are output in 20 separate outputs. In addition, the address controller 9 comprises a down counter 90 and in read mode the address controller 9 sequentially outputs 4-bit down count data DWDAT output from the down counter 90.

Furthermore, the address controller 9 also outputs a read-write control signal R/W which rises to the H level in read mode and falls to the L level in write mode and a switch signal NTSEL which rises to the H level when audio data is written and falls to the L level when address data is written. The control signal R/W, switch signal NTSEL, 1-bit address data and 4-bit audio data VODAT are inputted to a switching circuit 12.

Figure 2:
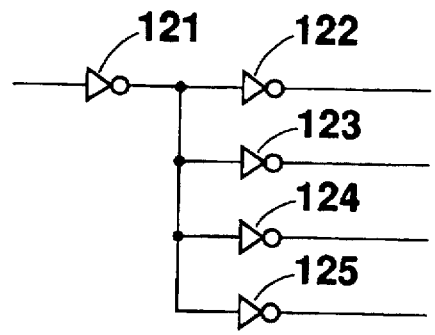
FIG. 2 is a circuit diagram depicting a detailed configuration of the bit number converting circuit shown in FIG. 1.

The switching circuit 12 comprises a bit number converting circuit 13 for converting address data output in 1-bit units to 4-bit address data ADDAT, a first multiplexer 14 to which are input the converted 4-bit address data ADDAT and the 4-bit down count data DWDAT for selectively outputting either of these 4-bit data in compliance with a read-write control signal R/W, and a second multiplexer 15 to which are input 4-bit data output from the first multiplexer 14 and 4-bit audio data VODAT from the ADPCM encoder 2 for selectively outputting either of these 4-bit data in compliance with the switch signal NTSEL. As FIG. 2 shows, the bit number converting circuit 13 consists, for instance, of five invertors 121~125 and outputs 4-bit address data wherein all four bits are at the same level as the input 1-bit address data.

Operation of the apparatus shown in FIG. 1 will next be explained in detail.

First, the apparatus changes to write mode when the microcomputer interface circuit 8 sends an audio data write command to the address controller 9. Since the address controller 9 changes the read-write control signal R/W to the L level, the first multiplexer 14 selects the output of the bit number converting circuit 13. Next, the address controller 9 changes the switch signal NTSEL to the H level and sequentially outputs an X address ADRX and a Y address ADRY indicating the address at which writing is to be executed. In compliance with the fact that the switch signal NTSEL is now at the H level, the second multiplexer 15 selects audio data VODAT to be input in 4-bit units and sequentially outputs them to the plurality of read-writing circuits 40, 41, 42 . . .

At the plurality of read-writing circuits 40, 41, 42 . . . , the sequentially inputted 4-bit (n-bit) audio data VODAT are captured and held by data registers provided within every read-write circuit. When capturing for a predetermined number of read-write circuits is completed, these predetermined read-write circuits carry out the writing operation simultaneously, convert the held 4-bit audio data VODAT to one level of ($2^4$=16) level discrete analog amounts (discontinuous analog amounts) and write one of the successively 16 analog amounts in a selected memory cell of the EEPROM cell array 3 via the X address decoder.

The storing resolution of the audio data VODAT resulting from this write operation is thus "16".

When the audio data write operation described above is completed, the microcomputer interface circuit 8 generates a write termination command. The address controller 9 sets the switch signal NTSEL to the L level in compliance therewith and begins to output as address data in 1-bit units the start address and/or stop address at which audio data have been stored. These 1-bit address data are converted by the bit number converting circuit 13 to 4-bit address data ADDAT wherein all bits are at the same level as input data by converting "1" to "1111" and "0" to "0000". Since the second multiplexer 15 selects the output of the bit number converting circuit 13 in compliance with the switch signal NTSEL's change to the L level, "1111" or "0000" 4-bit data are thus input to the read-writing circuits.

In this case, in other words, either of the ($2^1$=2) level data corresponding to 1-bit of address data (i.e. data "1111" and "0000") are stored in every memory cell of the EEPROM cell array 3. Storing resolution thus becomes "2" which is lower than the audio data resolution "16". When address data are written, addresses ADRX and ADRY corresponding to a second area 32 of the EEPROM cell array 3 are outputted from the address controller 9.

Alternatively, the apparatus changes to read mode when the microcomputer interface circuit 8 sends a read command to the address controller 9. Since the address controller 9 sets the read write control signal R/W to the H level, the first multiplexer 14 selects the 4-bit down count data DWDAT. Moreover, the address controller 9 sequentially outputs the down count data DWDAT and sets the switch signal NTSEL to the L level and then the down count data DWDAT is also output through the second multiplexer 15. This down count data DWDAT is output in order to AD convert the multi-level data read out at the read-write circuits to 4-bit digital data, an operation which will be explained in detail below.

In this reading operation, the address controller 9 first specifies addresses ADRX and ADRY corresponding to the second area 32 of the EEPROM cell array 3 and instructs read-write circuits 40, 41, 42 . . . to execute the reading operation and reads out a start address and a stop address stored in the second area 32. 4 bits of data RDAT are output from the read-writing circuit as a result of the reading, but only the uppermost bit D3 is input to the address controller 9 and this bit data is captured as address data. In other words, when the reading data is any level within the range "1000" to "1111", the capturing address data is "1" and when the reading data is any level within the range "0000" to "0111", the capturing address data is "0". Therefore, the storing resolution of the address data is "2" as mentioned above.

When reading out of the start and stop addresses is completed, the address controller 9, while outputting the above-mentioned down count data DWDAT, sequentially specifies addresses ADRX, ADRY from the start address and stop address which have been read out and instructs the read-write circuits 40, 41, 42 . . . to execute reading. Consequently, the 16 multi-state data stored in the first area 31 of the EEPROM cell array 3 are read out as 4-bit audio data and outputted to the ADPCM decoder 10. Here, extension processing is carried out to the data which are then decoded to 12 bits of original digital audio data. The digital audio data decoded at the DA converter 11 is converted to an analog audio signal and outputted. Since 16 discrete analog amounts are converted to original 4-bit digital data, the storing resolution in this case is "16".

As explained above, high-density recording can be realized in a single EEPROM cell array 3 since audio data is stored at high resolution while data reliability can also be ensured since address data is stored at low resolution.

The detailed configuration of read-write circuits 40, 41, 42 . . . depicted in FIG. 4 will next be explained.

Figure 4:
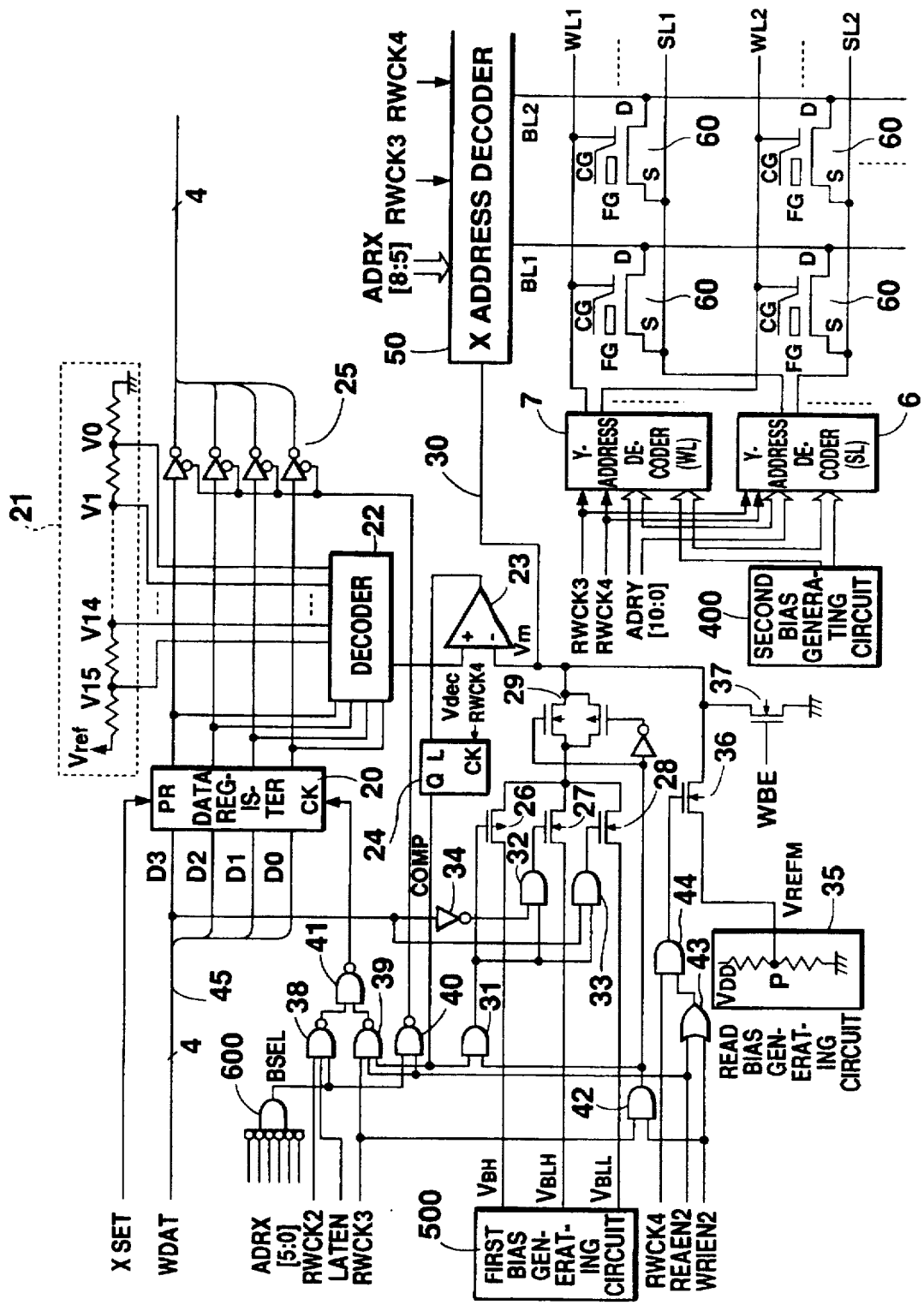
FIG. 4 is a circuit diagram showing a detailed configuration of a read-write circuit in the present invention.

In FIG. 4, a data register 20 consisting of D flip-flops is a 4-bit data register for capturing and holding 4-bit digital data outputted from the second multiplexer 15. A resistance dividing circuit 21 is a circuit for dividing reference voltage Vref into 16 voltages V0–V15 (V0<V1< . . . <V14<V15). A decoder 22 decodes the data held in the data register 20 and selectively outputs one of the 16 voltages V0–V15 in accordance with this data. A comparator 23 is provided an analog voltage Vdec outputted from the decoder 22 to a non-inverting terminal+and a voltage Vm read out from the memory cell 60 of EEPROM 3 to an inverting terminal –, and then compares these voltages. When a timing clock RWCK 4 is at the H level, a latch circuit 24 outputs unaltered the output from the comparator 23 and when the clock RWCK 4 changes from the H level to the L level, the latch circuit 24 latches the output from the comparator 23 and outputs this latched output during the clock RWCK 4 L level. An output buffer 25 is a buffer for outputting the data held in the data register 20 and, when a writing operation is carried out, this output buffer 25, a resistance dividing circuit 21, and a decoder 22 together comprise a DA converter.

Each memory cell 60 of the EEPROM 3 is a split gate-type cell with a floating gate FG which writes by injecting electric charge to the floating gate FG and erases by extracting the electric charge injected to the floating gate FG. A drain D of each memory cell 60 is connected to a bit line BL1, BL2, . . . a source S is connected to a source line SL1, SL2, . . . , a control gate CG is connected to a word line WL1, WL2 . . . An x address decoder 50 for decoding an upper 4-bit X address ADRX [8:5] selects one line from each bit line BL1, BL2, . . . and the selected line is connected to the inverting terminal of the comparator 23. The word lines WL1, WL2 . . and source lines S1, S2 . . . are each connected to respective Y address decoders 6 and 7 which decode an 11-bit Y address [10:0] while a variety of bias voltages is supplied to these decoders 6, 7 from a second bias generating circuit 400. These bias voltages include a high voltage bias Vhv 1 for writing and a high voltage bias Vhv 2 for erasing.

RWCK 3, RWCK 4 and WBE are inputted to the address decoders 50, 6, 7 as timing signals. Moreover, the terms "drain" and "source" used here refer essentially to the operation condition when reading is executed.

The 3 types of bias voltage VBH, VBLH, VBLL (VBH>VBLH>VBLL) supplied to bit lines B1, B2 . . . are output from first bias generating circuit 500 and a P channel MOS transistor 26, an N channel MOS transistor 27 and an N channel MOS transistor 28 are inserted respectively as switches at the supply lines for these bias voltages. An analog switch 29, which is turned on only when writing is executed, is connected to the output side of these transistors and the output side of this analog switch 29 is connected to an input/output line 30 of the X address decoder 50. The COMP output of the latch circuit 24 is inputted at one input terminal of the AND gate 31 and the output of the AND gate 31 is applied to the gate of the P channel MOS transistor 26. The outputs of AND gates 32 and 33 are applied at the gates of N channel MOS transistors 27 and 28 respectively. The output of AND gate 31 is likewise input at one input terminal of AND gates 32 and 33, a signal consisting of the upper bit D3 of the data to be supplied to the data register 20 reversed by an invertor 34 is input at the other input terminal of AND gate 32, and the upper bit D3 of the data to be supplied to the data register 20 is input unchanged at the other input terminal of AND gate 33.

In addition, a read bias generating circuit 35 comprising a resistance dividing circuit is provided in order to read as a voltage the analog amount written in each memory cell 60. The voltage division point P is connected to the input/output line 30 for the X address decoder 50 via the N channel MOS transistor 36 which is turned on only when the comparator 23 is executing comparison. An N channel MOS transistor 37 activated by a control signal WBE is inserted between the input/output line 30 and the ground in order to supply ground potentials to the bit lines B1, B2 . . . when memory cell data are erased.

The read-write circuit shown in FIG. 4 organizes 8 memory cells into 1 block in the X address direction and each block is equipped with a block selector 600 in order to detect the fact that it has been selected. In block No. 0 shown in FIG. 4, the block selector 600 consists of an AND gate for detecting whether the lower 6-bit X address ADRX [5:0] is ALL "0."

Moreover in FIG. 4, a sampling clock RWCK 2 and a latch-enable signal LATEN and the block selector 600 output BSEL are input to NAND gate 38, a timing clock RWCK 3 and a read-enable signal REAN 2 and COMP output are inputted to NAND gate 39, the block selector 600 output BSEL and a read-enable signal REAEN 2 are inputted to NAND gate 40, and the output of both NAND gates 38 and 39 are input to NAND gate 41. The timing clock RWCK 3 and write enable signal WRIEN 2 are inputted to AND gate 42. A read-enable signal REAEN 2 and a write enable signal WRIEN 2 are input to OR gate 43 and timing clock RWCK 4 and the output from OR gate 43 are input to AND gate 44. The output of NAND gate 41 is applied at a clock terminal CK of the D flip-flop comprising the data register 20, the output of NAND gate 40 is applied as an ON/OFF control signal of an output buffer 25, the output of AND gate 42 is applied as an ON/OFF control signal of an analog switch 29, and the output of AND gate 44 is applied to the gate of the N channel MOS transistor 36.

The write operation and read operation of the read-write circuit depicted in FIG. 4 will next be explained with reference to the timing chart shown in FIGS. 5 and 6. The bias conditions at each operation aspect of the memory cells 60 are as depicted in FIG. 7.

First, prior to the writing operation, latch mode commences in order to latch the data in the data register 20. In latch mode, 4 bits of digital data D3, D2, D1, D0 are sent to an input line 45 while the memory cell 60 of EEPROM 3 addresses ADRX and ADRY at which the data are to be written are sent from the address generating circuit 10 while the signal LATEN which indicates latch mode rises to the H level. When the lower 6-bit ADRX [5:0] of the outputted X address matches its own block number, the block selector 600 output rises to the H level. Consequently, the NAND gate 38 output at the start of the sampling pulse RWCK 2 change to the L level and then the NAND gate 41 output rises to the H level. Therefore, a clock is applied at the clock terminal CK of the D flip-flop consisting of a data register 20 and input data D1 and D0 are captured by the data register 20.

When capture is completed, signal WBE rises to the H level, the N channel MOS transistor 37 turns to ON, and the input/output line 30 has ground potential 0V. Since a bit line BL selected by the X address ADRX [8:5] is connected to the input/output line 30 at the X address decoder 50, that bit line BL also becomes 0V. Alternatively, since a high voltage bias Vhv 2 for erasure is applied at the selected word line WL by the Y address decoder 7 and 0V from the Y address decoder address decoder 6 is applied at the source line SL, the selected memory cell is thus erased. In other words, the electric charge to the floating gate FG of the memory cell 60 is extracted.

Once erasure is completed, the operation enters the actual write mode.

Figure 5:
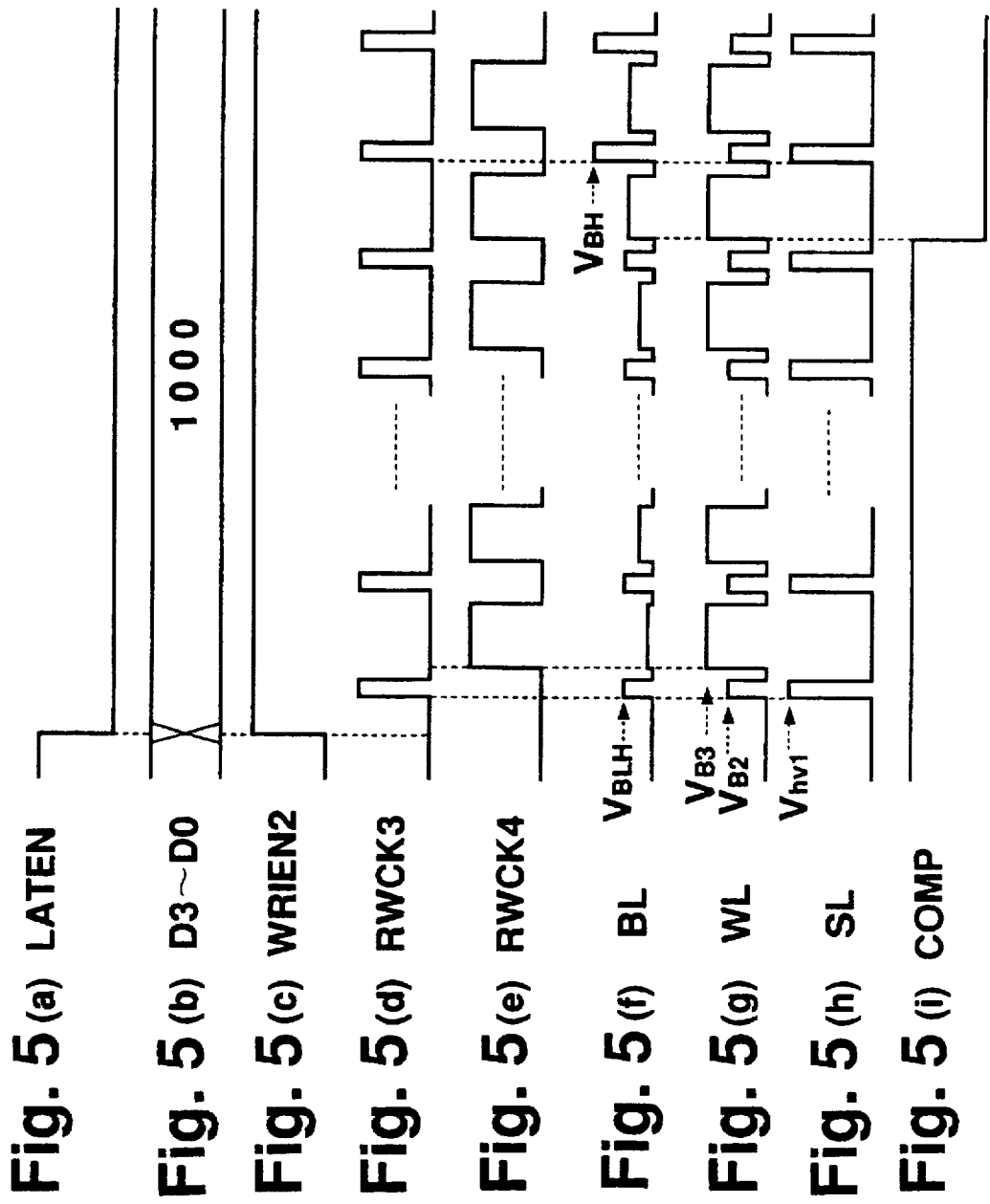
FIGS. 5a–5i are timing chart showing an operation in write mode of a read-write circuit in the present invention.

During the writing operation, the signal WRIEN 2 rises to the H level as shown in FIG. 5 (c) and consequently while the clock RWCK 3 is at the H level as in FIG. 5 (d) the output of the AND gate 42 rises to the H level. Moreover, since the latch circuit 24 is initially set at the H level, the output of the AND gate 31 also rises to the H level. Therefore, the analog switch 29 is now ON and the P channel MOS transistor 26 is OFF.

If the upper bit D3 of the input data is now "0" the AND gate 32 output rises to the H level and therefore the N channel MOS transistor 27 turns ON and the bias voltage VBLH is supplied to the selected bit line BL via the analog switch 29, the input/output line 30, and the X address decoder 50 as shown in FIG. 5 (f). Alternatively, if the upper bit D3 of the input data is "1", the AND gate 33 output rises to the H level and therefore the N channel MOS transistor 28 turns ON and the bias voltage VBLL is supplied to the selected bit line BL via the analog switch 29, the input/output line 30, and the X address decoder 50.

While the clock RWCK 3 is at the H level, high voltage Vhv 1 is supplied to the source line SL selected by the Y address decoder 6 (FIG. 5 (h)) and VB2 is supplied to the word line WL selected by the Y address decoder 7 (FIG. 5 (g)), therefore the writing conditions shown in FIG. 7 are satisfied and writing is executed in the memory cell 60. In other words, charge injection to the floating gate FG of the memory cell 60 commences.

Next, the clock RWCK 3 changes to the L level and, when clock RWCK 4 rises to the H level as shown in FIG. 5 (e), the analog switch 29 switches to OFF, the N channel MOS transistor 36 turns to ON, and the voltage division point P on the read bias generating circuit 35 is connected to the input/output line 30 since the AND gate 42 output changes to the L level and the AND gate 44 output rises to the H level. The potential of the voltage division point P is set at a voltage VREFM slightly higher than v4 when the N channel MOS transistor 36 is OFF. Moreover in this state, since VB1 is applied to a selected word line WL by the Y address decoder 7 and OV is applied to the source line SL by the Y address decoder 6, the selected memory cell 60 is now in the reading state. Thus a voltage Vm corresponding to the charge injected at the floating gate FG of the memory cell 60 is obtained at the input/output line 30 and the comparator 23 then compares this voltage Vm with the voltage Vdec output from the decoder 22.

In response to data latched by the data register 20, the decoder 22 selects an analog voltage of one the 16 voltages V0 –V15 from the resistance dividing circuit 21 and outputs this to the non-inverting terminal of the comparator 23.

If the comparison shows that Vdec>Vm, the output of the comparator 23 remains at the H level and the writing operation based on the clock RWCK 3, the reading operation based on the clock RWCK 4, and the comparing operation described above are repeated. By repeating the writing operation, the amount of charge injected to the floating gate FG increases and the reading voltage vm rises as shown in FIG. 5 (f). When Vdec≦Vm, the output of the comparator 23 and the output COMP of the latch circuit 24 both reverse to the L level. Consequently, the output of the AND gate 31 reverses from the H level to the L level, the P channel MOS transistor 26 turns to ON, the output of AND gates 32, 33 changes to the L level and both N channel MOS transistors 27, 28 switch to OFF. As a result, when the clock RWCK 3 has reached the H level, the bias voltage VBH is supplied to the bit line BL of the memory cell via the analog switch 29 (see FIG. 5(f)). In other words, the write bias conditions depicted in FIG. 7 break down and the writing operation is terminated.

As described above, in write mode 16 analog amounts corresponding to 4-bit inputted digital data are stored at a selected memory cell 60.

Operation in read mode will next be explained with reference to FIG. 6.

Figure 6:
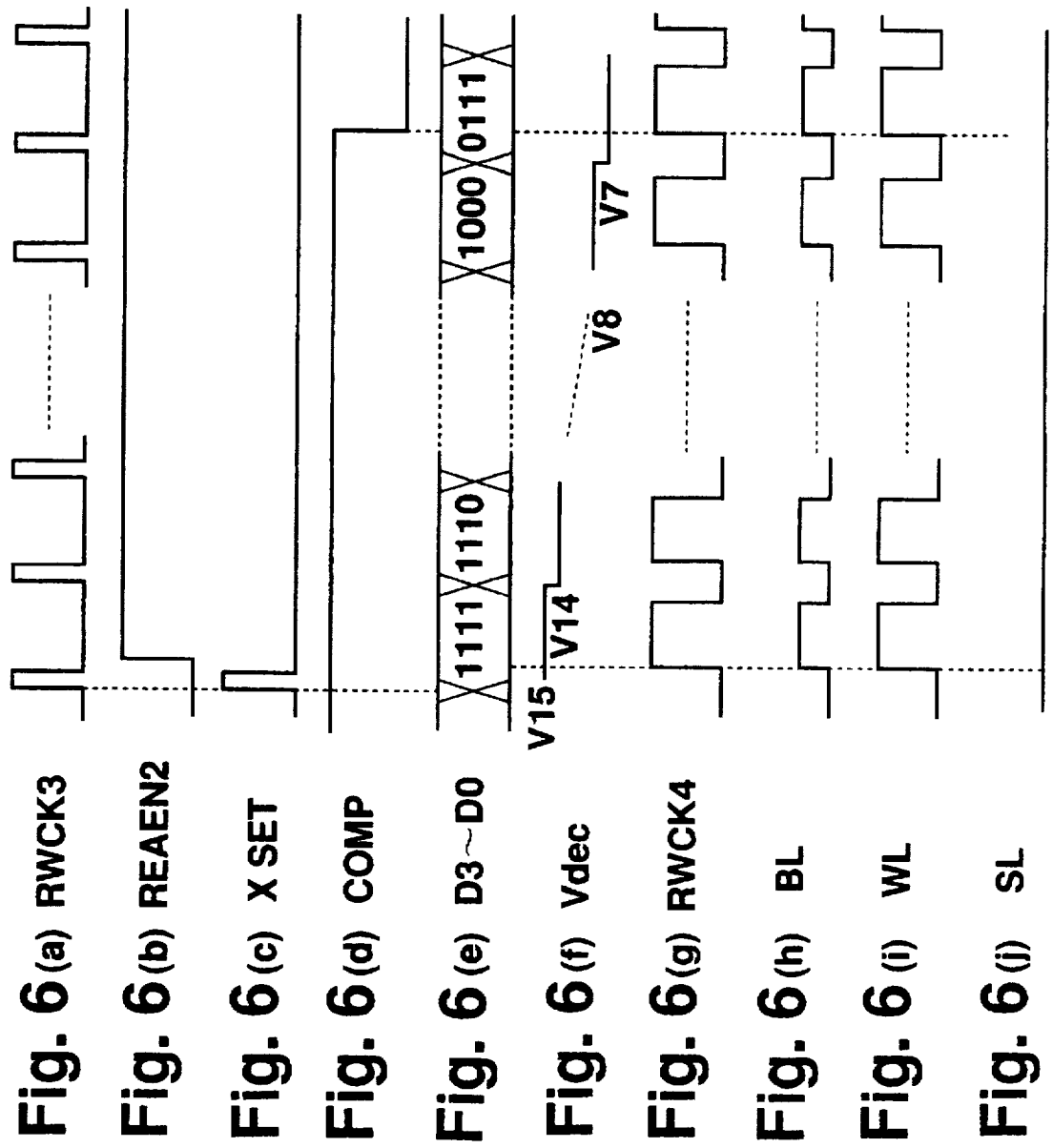
FIGS. 6a–6i are timing chart showing an operation in read mode of a read-write circuit in the present invention.

In read mode, when signal XSET (FIG. 6 (c)) rises to the H level, an initial value of ALL "1" is set in the data register 20 (FIG. 6 (e)) and an analog voltage V15 corresponding to ALL "1" is output from the decoder 22 as shown in FIG. 6 (f). When the clock RWCK 4 then rises to the H level as shown in FIG. 6 (g), as the bias conditions for the memory cell 60 are exactly the same as those when executing read operation in write mode, the inverting terminal of the comparator 23 obtains a voltage vm corresponding to the charge injected at the floating gate of the selected memory cell and compares this voltage vm with the voltage V15 outputted from the decoder 22. If this comparison shows that Vm>V15, the comparator 23 and the latch circuit 24 output COMP change to the L level and the output of the NAND gate 39 therefore rises to the H level. Since the output of the NAND gate 38 is fixed at the H level at this time, the output of the NAND gate 41 now changes to the L level and the ALL "1" value is thus held in the data register 20 without any subsequent latching.

Alternatively, if the result of the comparison is that Vm ≦V15, the comparator 23 and the latch circuit 24 output COMP change to the H level and therefore when the clock RWCK 3 rises to the H level as in FIG. 6 (a), the output of the NAND gate 39 changes to the L level. As a result, the NAND gate 41 outputs a clock signal to the data register 20 and the data register 20 latches the data supplied by the data input line 45. During read mode, since data "D3, D2, D1, D0" at "1110", "1101", "1100". . . "0001", "0000" are sequentially output from the down counter 90 shown in FIG. 1 on this data input line 45 each time the clock RWCK 4 changes to L level, the data register 20 latches data "1110" as shown in FIG. 6 (e) after data "1111". When the decoder 22 output Vdec then decreases to voltage V14 as shown in FIG. 6 (f) and the clock RWCK 4 reverts to the H level, the comparator 23 compares the voltage V14 with the voltage Vm corresponding to the analog amount read from the memory cell. If Vm>V14, the comparator 23 and the latch circuit 24 output COMP reverse to the L level and "1110" is thus held in the data register 20 without any subsequent latching. If the comparison result shows that Vm≦V14, the comparator 23 and the latch circuit 24 output COMP remain at the H level and the data register 20 therefore latches the next data "1101" and the comparator 23 compares V13 with Vm. If this comparison shows that Vm>V13, the data held in the data register 20 is fixed at "1101", but if Vm≦V13 the data register 20 latches the next data "1100" and the comparator 23 compares vm and V12. The above operation is repeated and if the comparison when "0111" is latched at data register 20 shows that Vm>V7, the COMP output of the comparator 23 and the latch circuit 24 reverse to the L level and the content of the data register 20 is fixed at "0111" as shown in FIG. 6 (e).

Thus a voltage Vm corresponding to an analog amount read from a memory cell is AD converted by a data register 20, a resistance dividing circuit 21, a decoder 22, a comparator 23, a NAND gate 39, and a NAND gate 41 and AD converted digital data obtained by selection of a block selector 600 are then sent to an external portion through an output buffer 25.

Embodiment 2

In the switching of storing data resolution in the first embodiment described above, the bit number converting circuit 13 of the switching circuit 12 (FIG. 1) converts m-bit address data consisting of the second type of digital data to n-bit digital data of which the upper m bits of n-bit (n>m) digital data is the m-bit address data and the lower i-bit are the same level as the m-bit address data. Consequently, while the storing resolution of n-bit audio digital data consisting of the first type of digital data is "16" when n=4, if, for instance, m=1 for the m-bit address data, n-bit digital data obtained by conversion (wherein for instance n=4) are of two kinds: "0000" and "1111" and the storing resolution is "2".

In a second embodiment, address data requiring high reliability are stored in an EEPROM cell array as multi-level data and the storing resolution is reduced to a value lower than the storing resolution of audio data.

Described in more detail, in the present embodiment 2, in address data writing mode, address data are converted to n-bit digital data which is the address data and of which the lower i-bit is a predetermined level. The device then has the upper m bits n bit digital data and a gate circuit provided to a switching circuit or a read-writing circuit fixes the lower i-bit of n bit digital data in a fixed level.

A detailed configuration of the second embodiment will next be explained using the diagrams. Where the configuration is the same as that of the first embodiment, identical numbering is used in the diagrams and explanation is omitted.

Figure 8:
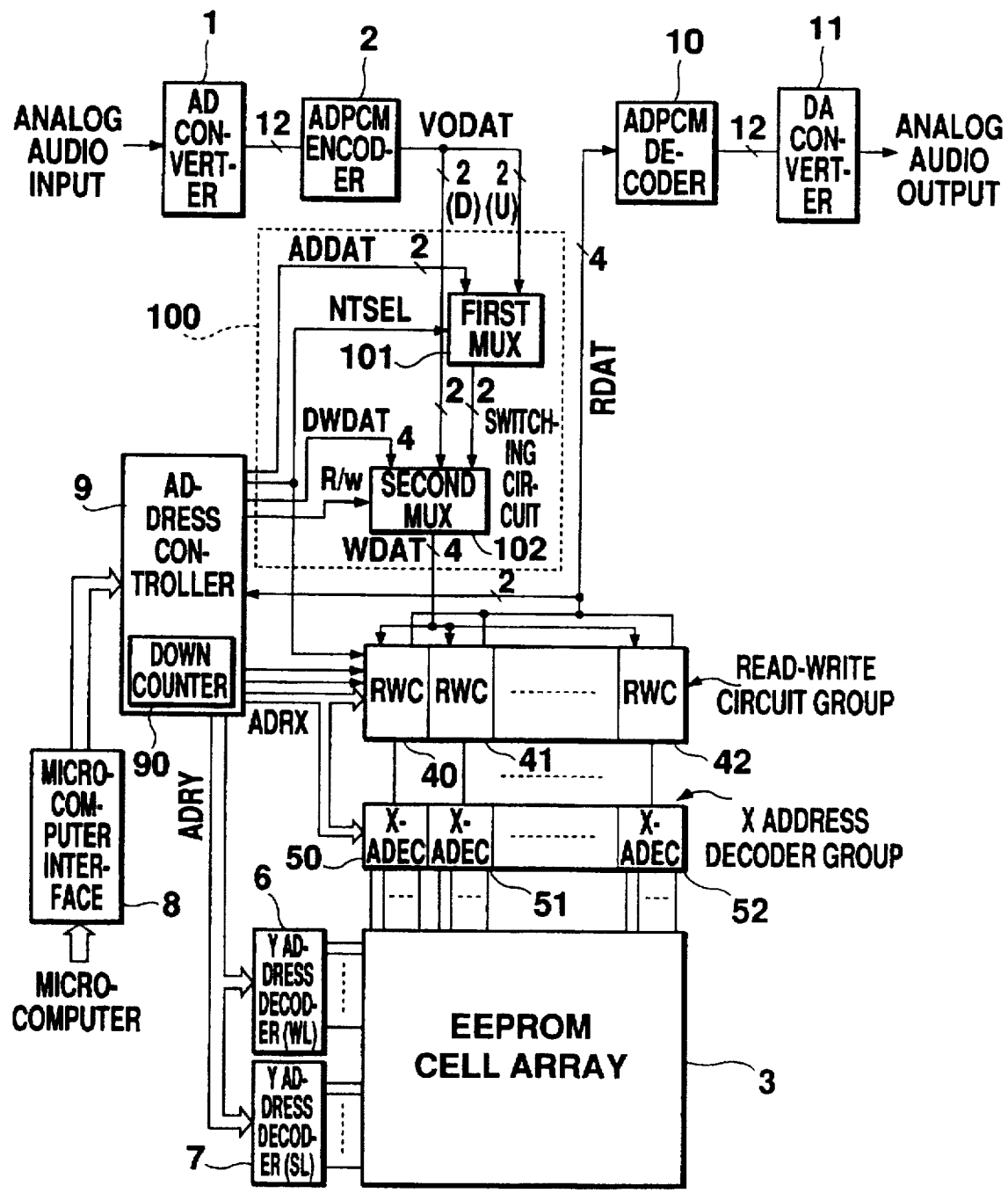
FIG. 8 is an overall block diagram of an audio record play apparatus implementing a second embodiment of the present invention.

FIG. 8 is an overall block diagram of an audio record play apparatus implementing a second embodiment of the present invention. In the diagram, as in the first embodiment, an EEPROM cell array 3 has a first area 31 for storing audio data VODAT output from an ADPCM encoder 2 and a second area 32 for storing a start address and a stop address indicating the first and last addresses of stored audio data. In order to store these start and stop addresses, an address controller 9 in write mode outputs a start address and a stop address as address data ADDAT. However, in the second embodiment, address data are output every 2 bits, unlike audio data which are outputted every 4 bits, thus X and Y addresses totalling 20 bits are outputted in 10 separate outputs. The address controller 9 is provided with a 4-bit down counter 90 and in read mode the address controller 9 sequentially outputs 4-bit down count data DWDAT output from the down counter 90.

Furthermore, the address controller 9 also outputs a read-write control signal R/W which rises to the H level in read mode and falls to the L level in write mode and a switch signal NTSEL which rises to the H level when audio data is written and falls to the L level when address data is written. The control signal R/W, switch signal NTSEL, 2-bit address data, and 4-bit audio data VODAT are inputted to a switching circuit 100. In addition, in the second embodiment the switch signal NTSEL is input to read-write circuits 40, 41, 42, 43 . . . to which are also input 4-bit data WDAT from a first multiplexer 14.

The switching circuit 100 is provided with a first multiplexer 101 and a second multiplexer 102 wherein the upper 2 bits of the 4-bit audio data VODAT from the ADPCM encoder 2 and 2-bit address data ADDAT output from the address controller 9 are input to the first multiplexer 101 and, in compliance with the switch signal NTSEL, either the upper 2 bit (m bits) VODAT or 2-bit (m bits) ADDAT is selected and output. The second multiplexer 102 is input the 2-bit (m-bit) data output from the first multiplexer 13 as the upper 2-bit data and passes the lower 2 bits (i bits; i=n−m) of the 4-bit audio data VODAT unaltered to the input terminals as lower data. Furthermore the data is input, 4-bit down count data DWDAT are input to the other input terminal of the second multiplexer 102. Then either one of the 4-bit down count data DWDAT and the 4-bit output data from the first multiplexer 101 and the lower 2 bits of the audio data VODAT are selectively output in accordance with a read-write control signal R/W from the second multiplexer 102.

Operation of the apparatus shown in FIG. 8 will next be explained in detail.

First, the apparatus changes to write mode when the microcomputer interface circuit 8 sends an audio data write command to the address controller 9. Since the address controller 9 sets the read-write control signal R/W to the L level, the second multiplexer 102 selects an output from the ADPCM encoder 2 and the first multiplexer 101. Next, the address controller 9 changes the switch signal NTSEL to the H level while sequentially outputting an X address ADRX and a Y address ADRY indicating the address at which writing should be executed. Consequently, in compliance with the fact that the switch signal NTSEL is now at the H level, the first multiplexer 101 selects the upper 2 bits of audio data VODAT input in 4-bit units and sequentially outputs 4 bits of audio data VODAT to the plurality of read-writing circuits 40, 41, 42 . . .

At the plurality of read-write circuits 40, 41, 42 . . . , sequentially inputted 4-bit (n-bit) audio data VODAT are captured and held by data registers provided within every read-write circuit. When capturing for a predetermined number of read-write circuits is completed, these predetermined read-write circuits simultaneously carry out the writing operation, convert the held 4-bit audio data VODAT to one of ($2^4$=16) level discrete analog amounts, and write one of the 16 successively converted analog amounts in a selected memory cell of the EEPROM cell array 3 via the X address decoder.

The resolution of the audio data VODAT resulting from this write operation is thus "16".

When the audio data write operation described above is completed, the microcomputer interface circuit 8 generates a write termination command. The address controller 9 sets the switch signal NTSEL to the L level in compliance with this write termination command and begins to output as address data in 2-bit units a start address and/or a stop address at which audio data have been stored. These 2-bit address data ADDAT are selected by the first multiplexer 101 and input to the read-write circuits via the second multiplexer 102.

Figure 9:
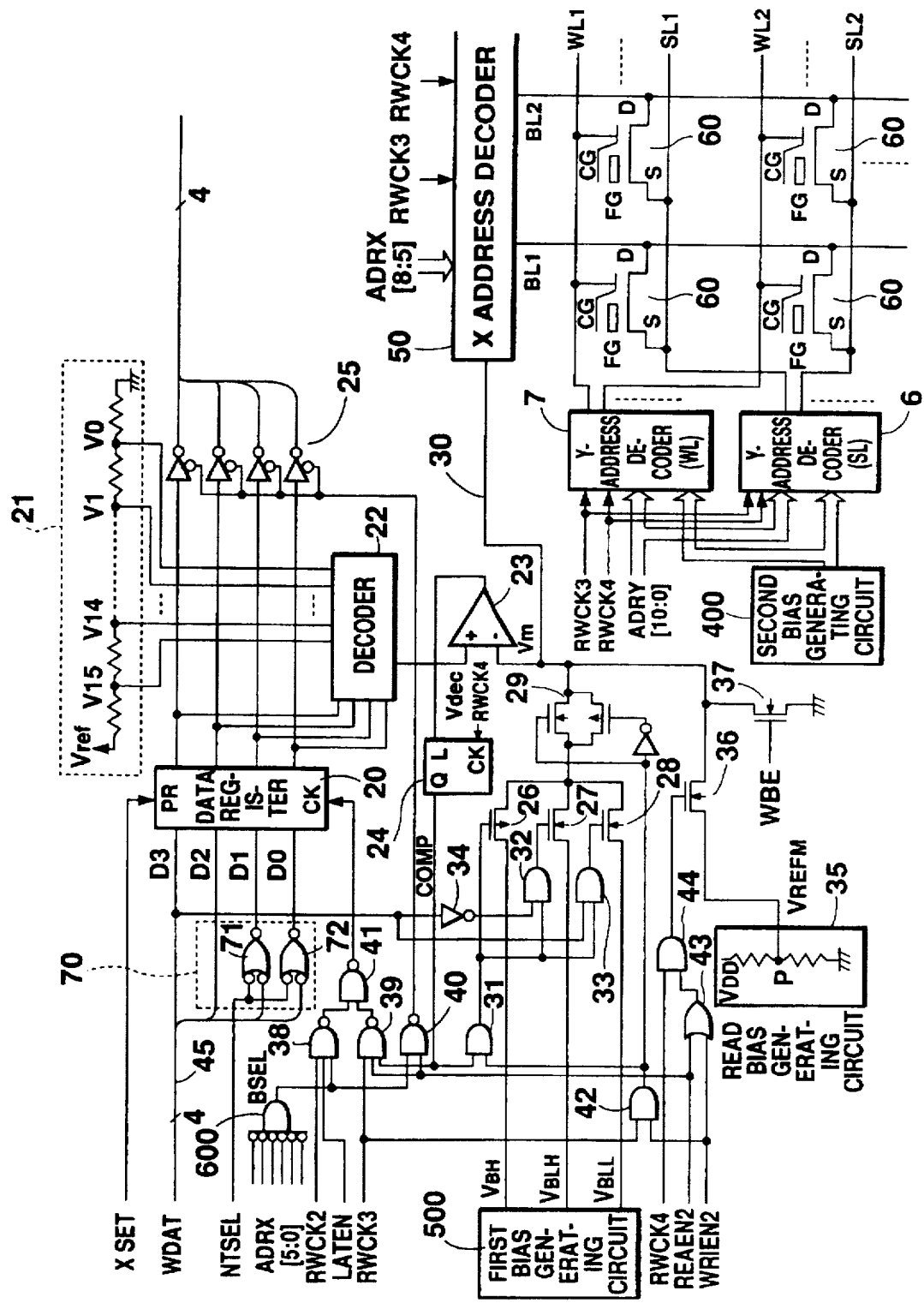
FIG. 9 is a circuit diagram showing a detailed configuration of a read-write circuit in a second embodiment of the present invention.

Each of the read-write circuits 40, 41, 42 . . . has a configuration as shown in FIG. 9. As FIG. 9 shows, each circuit comprises a 4-bit data register 20 consisting of D flip-flops for capturing and holding 4-bit digital data output from the second multiplexer 102, a resistance dividing circuit 21, a decoder 22, a comparator 23 for comparing an analog voltage Vdec outputted from the decoder 22 with a voltage Vm read out from the memory cell 60 of EEPROM 3, a latch circuit 24 for latching the output from the comparator 23 prior to the timing clock RWCK 4 falling from the H level to the L level and for outputting a latched output when the clock RWCK 4 is at the L level, and an output buffer 25 for outputting the contents of data held in the data register 20.

Furthermore, in the present embodiment 2, AND gates 71 and 72 are inserted in input sides of the lower 2 bits (i bits) D0, D1 of the data register 20. The switch signal NTSEL is input to each individual input terminal of these AND gates 71, 72. The AND gates 71, 72 comprise a gate circuit 70. When the switch signal NTSEL is at the H level, these AND gates 71, 72 output the input data D0 and D1 unaltered and when the switch signal NTSEL is at the L level, the AND gates 71, 72 fix the data D0, D1 at the "0" level and output the data to the data register 20.

Consequently, when the switch signal NTSEL is at the L level, since the 2-bit address data are input to the upper 2 bits D2, D3 of the data register 20 and the lower 2 bits D0, D1 are fixed at "0", only the 4 input data "1100", "1000", "0100", "0000" are input when address data are written. Therefore, the decoder 22 subsequently only selects ($2^4$=4) analog voltages V12, V8, V4, V0 from the 16 analog voltages output from the resistance dividing circuit 21.

In other words, in this case one of 4 analog voltages V12, V8, V4, V0 is stored in the EEPROM cell array 3 and the storing resolution is thus "4", which is a lower storing resolution than the storing resolution of "16" for the audio data. When these address data are written, addresses ADRX, ADRY corresponding to the second area 32 of the EEPROM cell array 3 are outputted from the address controller 9.

Alternatively, read mode commences when the microcomputer interface circuit 8 generates a read command. The address controller 9 then changes the read-write control signal R/W to the H level while sequentially outputting the 4-bit down count data DWDAT. Consequently, the second multiplexer 102 selects the 4-bit down count data DWDAT and outputs them to the read-writing circuits 40, 41, 42 . . .

As in the first embodiment, in this reading operation, the address controller 9 first specifies addresses ADRX and ADRY corresponding to the second area 32 of the EEPROM cell array 3 and instructs read-writing circuits 40, 41, 42 . . . to execute the reading operation and reads out a start address and a stop address stored in the second area 32. In the present embodiment 2, 4 bits of data RDAT are output from the read-write circuits as a result of the reading, but only the upper bits D3 and D2 are input to the address controller 9 where these bit data are captured as address data. In other words, when the reading data is any value within the range "1100" to "1111", the capturing address data is "11"; when the reading data is any value within the range "1000" to "1011", the capturing address data is "10"; when the reading data is any value within the range "0100" to "0111", the capturing address data is "01"; and when the reading data are any value within the range "0000" to "0011", the capturing address data is "00". Therefore, the storing resolution of the address data is "4" as described above.

As in the first embodiment, when reading out of the start and stop addresses is completed, the address controller 9, outputs the above-mentioned down count data DWDAT. The address controller 9 then sequentially specifies addresses ADRX, ADRY from the start and stop addresses which have been read out and instructs the read-write circuits 40, 41, 42 . . . to execute reading. Consequently, one of the 16 multi-level data stored in the first area 31 of the EEPROM cell array 3 is read out as 4-bit audio data and output to the ADPCM decoder 10. Here, extension processing is carried out to the data which is then decoded to 12 bits of original digital audio data. The decoded digital audio data are converted to an analog audio signal at the DA converter 11 and output. In this case, since one of 16 discrete analog amounts is converted to original 4-bit digital data; the storing resolution in this case is "16".

Unless the outputs of AND gates 71, 72 of the gate circuit 70 are fixed in compliance with the switch signal NTSEL as described above, the read-write circuit shown in FIG. 9 operates in the same way as the read-write circuit in the first embodiment. The read-write circuit then carries out writing and reading of analog amounts in each memory cell and also sends digital data in compliance with the read out data to an external portion.

Figure 10:
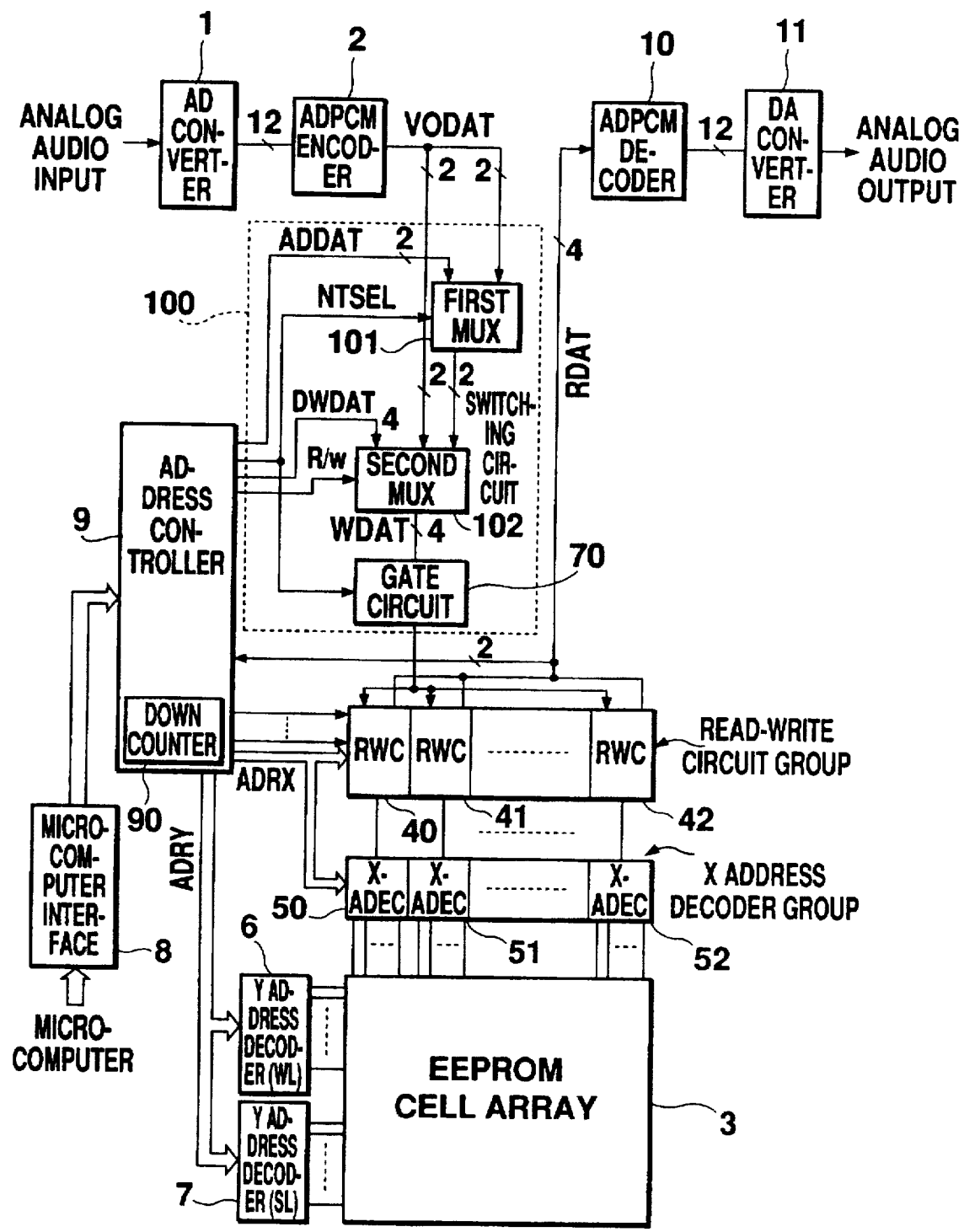
FIG. 10 is an overall block diagram of an audio record-play apparatus implementing an embodiment of the present invention with a different configuration from that shown in FIG. 8.

FIG. 10 shows an example of another configuration of the second embodiment. This configuration differs from the above-mentioned FIGS. 8 and 9 in that a gate circuit 70 for setting the lower i bits of n bits of digital data at a fixed level in accordance with a switch signal is provided to the output side of the second multiplexer 102 of the switching circuit 100 and not at the data register 20 input side. In the configuration shown in FIG. 10, the lower i bits of n-bit digital data to be held in each data register of the read write circuits 40, 41, 42 . . . can be fixed in the same way as described above and the upper m bits can be deemed identical to m-bit address data. A gate circuit 70 may also be provided to the input side of the second multiplexer 102, specifically to the input side of the lower i bit audio digital data VODAT output from the ADPCM encoder 2.

In the second embodiment as described above, in a single EEPROM cell array 3, high-density recording can be realized since audio data is stored at high resolution and data reliability can be ensured since address data is stored at low resolution.

While there have been described what are at present considered to be preferred embodiments of the invention, it will be understood that various modifications may be made to the present invention and it is intended that the appended claims cover all such modifications as fall within the true spirit and scope of the invention.

What is claimed is:

1. A non-volatile multi-state memory device capable of storing a plurality of digital data types as multi-state data in a non-volatile memory cell array, said memory device comprising:

a switching circuit for switching storing resolution in accordance with the digital data type being stored, the storing resolution being switched for at least one of the data types by converting from digital data having a predetermined number of states, which number is less than the number of states of the multi-state data, to a predetermined multi-state data, so that all of the digital data types are stored in the memory cell array as multi-state data.

2. A non-volatile multi-state memory device according to claim 1, wherein the plurality of digital data types comprise a first type of digital data and a second type of digital data; and storing resolution of the second type of digital data has been reduced to lower than the storing resolution of the first type of digital data.

3. A non-volatile multi-state memory device according to claim 2, wherein the second type of digital data is an address data for indicating a storing address of the first type of digital data to be stored in the non-volatile memory cell array.

4. A non-volatile multi-state memory device according to claim 3, wherein the address data indicates at least one storing address of a storing start address and a storing stop address of first type of digital data in a non-volatile memory cell array.

5. A non-volatile multi-state memory device according to claim 3, wherein the first type digital data is an digital audio data.

6. A non-volatile multi-state memory device according to claim 2, wherein the first type of digital data consists of n-bit data (n: whole number greater than 2) and the second type of digital data consists of m-bit data (m:whole number<n); said memory device further comprising a writing circuit for writing n-bit inputted digital data in the non-volatile memory cell array as corresponding multi-state data; and wherein when a switch signal to be input is at a first level, the switching circuit outputs the n-bit first type of digital data unaltered to the writing circuit and wherein when the switch signal is at a second level, the switching circuit converts the m-bit second type of digital data to n-bit digital data of which at least the upper m-bit of the n-bit digital data is the m-bit second type of digital data and the said switching circuit outputs the n-bit digital data to the writing circuit.

7. A non-volatile multi-state memory device according to claim 6, wherein when the switch signal is at the second level, the switching circuit converts the m-bit second type of digital data to n-bit digital data which an upper m-bit of the n-bit digital data is the m-bit second type of digital data and a remaining lower i-bit (i:whole number equivalent to n−m) of the n-bit digital data is a same level as a level of the m-bit second type of digital data.

8. A non-volatile multi-state memory device according to claim 7, wherein the m bit is 1 bit and the switching circuit includes a converting circuit for converting m-bit second type of digital data to n-bit digital data wherein all bits have the same level as m-bit second type of digital data.

9. A non-volatile multi-state memory device according to claim 6, wherein when a switch signal is at a second level, the switching circuit converts the m-bit second type of digital data to n-bit digital data of which an upper m-bit of the n-bit digital data is the m-bit second type of digital data and a remaining lower i-bit (i:whole number equivalent to n—m) of the n-bit digital data is a predetermined level.

10. A non-volatile multi-state memory device according to claim 9, wherein the switching circuit includes a gate circuit for fixing the lower i-bit of the n-bit digital data to a predetermined level when the switch signal is at a second level.

11. A non-volatile multi-state memory device according to claim 6, wherein said memory device further comprises a switch signal generating circuit for generating the switch signal which varies depending on whether data to be written are the first type of digital data or the second type of digital data and for supplying the switch signal to the switching circuit.

12. A non-volatile multi-state memory device according to claim 6, wherein the second type of digital data is address data for indicating a storing address of the first type of digital data to be stored in the non-volatile memory cell array.

13. A non-volatile multi-state memory device according to claim 6, said memory device further comprising a first data generating circuit for sequentially outputting first type of digital data in n-bit units; and a second data generating circuit for sequentially outputting second type of digital data in m-bit units.

14. A non-volatile multi-state memory device according to claim 13, wherein the second type of digital data is an address data for indicating a storing address of the first type of digital data to be stored in the non-volatile memory cell array; and the second data generating circuit is comprised from an address controller for outputting the address data.

15. A non-volatile multi-state memory device according to claim 14, wherein the address controller generates the switch signal which varies in accordance with the type of digital data to be written.

16. A non-volatile multi-state memory device according to claim 6, wherein the writing circuit includes a data register for holding the n-bit digital data output from the switching circuit; and when the switch signal to be input is at the first level, the switching circuit outputs the n-bit first type of digital data unaltered to the data register and when the switch signal is the second level, the switching circuit converts the m-bit second type of digital data to n-bit digital data of which at least an upper m-bit of the n-bit digital data is the m-bit second type of digital data and outputs this n-bit digital data to the data register; and wherein the memory device further comprises a gate circuit laid at an input side of the lower i-bit (i =whole number lower than n ) of the data register for outputting input data unaltered when the switch signal is at the first level and for fixing output digital data at a predetermined level when the switch signal is at the second level.

17. A non-volatile multi-state memory device according to claim 16, wherein the writing circuit comprises a voltage generating circuit for generating a plurality of analog voltages;

a decoder for decoding data held in the data register and selectively outputting any one of the plurality of analog voltages in accordance with the content of data held in the data register; and a comparator for comparing a voltage corresponding to multi-level data read from the memory cell array with an output voltage of the decoder; and wherein writing of multi-level data is executed in response to a comparison result of the comparator.

18. A non-volatile multi-state memory device comprises:

a non-volatile memory cell capable of storing multi-state data; and a writing circuit for writing multi-level data corresponding to an input n-bit digital data (n: whole number greater than 2) in the non-volatile memory cell, wherein said writing circuit includes:

a data register for holding the n-bit digital data input thereto; and a gate circuit coupled to an input side of the lower i-bit(s) (i=whole number less than) of the n-bit data register, the gate circuit selectively fixing the lower i-bit(s) of digital data output from the data register, which is a portion of the n-bit digital data to be written in the non-volatile memory cell by the writing circuit, at a predetermined level in accordance with a switch signal.

19. A non-volatile multi-state memory device according to claim 18, wherein the gate circuit outputs unaltered input data when the switch signal is at a first level and fixes output data at a predetermined level when the switch signal is at a second level.

20. A non-volatile multi-state memory device capable of storing at least two digital data types as multi-state data in a non-volatile memory cell array, the two digital data types having different numbers of bits, said memory device comprising:

a switching circuit for switching storing resolution in accordance with the digital data type being stored, wherein the switching circuit operates such that:

one of the digital data types is stored at a first storing resolution by storing the digital data of that data type as multi-state data having a first number of bits, and another of the digital data types is stored at a second storing resolution by converting the digital data of that data type from digital data having a second number of bits, which is less than the first number of bits, to digital data having the first number of bits, and then storing the digital data of that data type as multi-state data having the first number of bits.

* * * * *